US009500886B2

(12) United States Patent
Tatsumi

(10) Patent No.: US 9,500,886 B2
(45) Date of Patent: Nov. 22, 2016

(54) OPTICAL MODULATOR DRIVER

(71) Applicant: SUMITOMO ELECTRIC INDUSTRIES, LTD., Osaka (JP)

(72) Inventor: Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/844,120

(22) Filed: Sep. 3, 2015

(65) Prior Publication Data

US 2016/0070123 A1 Mar. 10, 2016

(30) Foreign Application Priority Data

Sep. 4, 2014 (JP) ................................ 2014-180385

(51) Int. Cl.

*G02B 26/00* (2006.01)
*H03F 3/45* (2006.01)
*G02F 1/01* (2006.01)
*H04B 10/54* (2013.01)
*H03F 3/60* (2006.01)

(52) U.S. Cl.

CPC ......... *G02F 1/0121* (2013.01); *H03F 3/45089* (2013.01); *H03F 3/45475* (2013.01); *H03F 3/605* (2013.01); *H04B 10/54* (2013.01); *H03F 2203/45298* (2013.01); *H03F 2203/45392* (2013.01)

(58) Field of Classification Search

CPC ............. G02F 1/0121; H03F 3/45183; H03F 3/45475; H03F 3/605; H03F 3/45089; H03F 2203/45392; H03F 2203/45298; H04B 10/54; G02B 26/001

USPC ................ 359/237, 238, 276; 327/563, 561; 398/198; 330/250, 252

See application file for complete search history.

(56) References Cited

U.S. PATENT DOCUMENTS 6,064,507 A * 5/2000 Heflinger ............... H04B 10/69 250/214 A
7,031,042 B2 * 4/2006 Ogura .................. G02F 1/0123 341/137
7,373,090 B2 * 5/2008 Kazemi-Nia ......... G02F 1/0121 359/245
8,150,270 B2 * 4/2012 Bonthron ............ H03F 3/45089 398/182
9,369,100 B2 * 6/2016 Tatsumi .............. H03F 3/45089
2009/0009253 A1 1/2009 Shigematsu

FOREIGN PATENT DOCUMENTS

JP H09-130710 5/1997
JP 4952713 3/2012
JP 4965902 4/2012

* cited by examiner

*Primary Examiner* — Tuyen Tra

(74) *Attorney, Agent, or Firm* — Smith, Gambrell & Russell, LLP.

(57) ABSTRACT

In the optical modulator driver, a plurality of differential amplifiers are arranged in one direction, and input terminals and output terminals of each adjacent differential amplifier are connected via independent wirings. Each differential amplifier includes a differential pair and a series circuit. In the series circuit, a resistor, a capacitor, and a resistor are connected in series. The series circuit is provided between emitters of two transistors of the differential pair, one of the differential input terminals of the differential amplifier and one transistor of the differential pair are connected via a resistor, and the other of the differential input terminals of the differential amplifier and the other transistor of the differential pair are connected via a resistor.

3 Claims, 13 Drawing Sheets

OPTICAL MODULATOR DRIVER
Dout
Doutb
Re4
Re3
Lout3
Loutb3
Cell-4
Lin4
Linb4
Lout2
Loutb2
Cell-3
Lin3
Linb3
Cell-2
Lin2
Linb2
Lout1
Loutb1
Lin1
Linb1
Cell-1
Lout0
Re2
Loutb0
Re1
Din
Dinb DIFFERENTIAL OUTPUT VOLTAGE
Vout−Voutb [V]
DIFFERENTIAL
INPUT VOLTAGE
Vin−Vinb [V]
-0.3
-0.2
-0.1
0
0.1
0.2
0.3
TIME
TIME
In0
In1
In2
In3
Out0
Out1
Out2
Out3

Da
Cell-inb
Cell-in
Dc
Tr12
Tr11
Vcc
R5
R6
Vcon
C2
Is
Tr7
R7
Dd
Cell-out
Cell-out b
Tr5
Tr6
Tr3
R1
Db
Tr4
R2
R4
R3
C1

Amp1
Da
Cell-inb
Cell-in
Rb11
Rb12
Rp
Vcc
Dc
Tr11
Tr12
R5
R6
Cell-out
Cell-out b
Dd
Tr5
Tr6
Tr3
Tr4
Db
Df
Rf1
Cf1
Rf2
P1
P2
P3
R1
R2
R3
R4
C1
Vcon
C2
Tr7
R7
Is 100
OPTICAL MODULATOR DRIVER
Dout
Doutb
Din
Dinb
Re1
Re2
Re3
Re4
Lout0
Lout1
Lout2
Lout3
Loutb0
Loutb1
Loutb2
Loutb3
Lin1
Lin2
Lin3
Lin4
Linb1
Linb2
Linb3
Linb4
Amp1
Amp1
Amp1
Amp1

Amp2
Da
Cell-inb
Cell-in
Rp
Rb11
Rb12
C3
C4
Lp1
Vcc
Dc
Tr12
Tr11
R5
R6
Tr3
P1
R1
Tr5
Cell-out
Dd
Cell-out b
Tr6
Df
Rf1
Cf1
Rf2
P3
Db
Tr4
P2
R2
Vcon
C2
Tr7
R7
Is
R3
R4
C1

Amp3
Da
Cell-inb
Cell-in
Vcc
Dc
Tr12
Tr11
R5
R6
R8
R9
Lp2
C5
C6
Vcon
C2
Is
Tr7
R7
P3
Df
Rf1
Cf1
Rf2
Dd
Cell-out
Cell-out b
Tr5
Tr6
Tr3
P1
R1
Db
Tr4
P2
R2
R3
R4
C1

OPTICAL MODULATOR DRIVER

TECHNICAL FIELD

The present invention relates to an optical modulator driver that is used for an optical transmitter or the like.

BACKGROUND

In communication between servers in a data center and optical transmission systems constituting a core network, an optical transceiver to perform mutual conversion between an electric signal and an optical signal and to perform transmission and reception of the optical signal is heavily used in a physical layer of an OSI reference model. The optical transceiver includes a transmission part (optical transmitter) and a reception part (optical receiver). The optical transmitter includes a light source such as a semiconductor laser, an optical modulator to modulate CW (Continuous Wave) light output from the light source in response to a driving voltage and emit modulated CW light (optical signal), and an optical modulator driver to generate the driving voltage according to an electric signal and provide a bias voltage to be a reference voltage thereof. The optical transmitter converts the electric signal into the optical signal and transmit the optical signal to an optical waveguide such as an optical fiber (this corresponds to the case of an external modulation system (refer to FIG. 1)).

In order to drive the optical modulator at a symbol rate of 25 [Gbaud] or 40 [Gbaud], for example, a superior quality of waveforms such as high-speed falling/rising and low jitter is required in waveforms of driving signals. For this reason, it is necessary to suppress a reflection coefficient of a high frequency signal small up to a frequency of about 40 [GHz] for example. Patent Literature 1-3 disclosed driving techniques to suppress an S parameter S22 of a driver and an S parameter S11 of the optical modulator.

Patent Literature 1 disclosed technology for applying a technique of a travelling wave amplifier (TWA) to a differential amplifier. The TWA includes transmission lines formed between input terminals of a plurality of transistors and between output terminals thereof to broaden bandwidth. Patent Literature 2 disclosed a method of improving a frequency characteristic in a high frequency region when a TWA of a differential type (semiconductor IC chip) is mounted on a package (not illustrated in the drawings). Patent Literature 3 disclosed a capacitive source degeneration circuit as technology for improving a frequency characteristic having a right-downward slope caused by signal attenuation in an input transmission line (not illustrated in the drawings).

Digital coherent optical transmission systems having a large capacity of communication and a high speed performance have been developed for practical use to deal with a rapidly increasing demand of communication traffic for a network. Such digital coherent optical transmission systems have been incorporating PAM-4 (4-level Pulse Amplitude Modulation) and 16-QAM (16-level Quadrature Amplitude Modulation) as a modulation system.

Patent Literature 1: Japanese Patent Application Laid-Open No. H09-130170,

Patent Literature 2: Japanese Patent No. 4965602,

Patent Literature 3: Japanese Patent No. 4952713.

SUMMARY

As the optical modulator driver using the TWA according to the related art, a structure of a TWA is illustrated in FIG.

2. An optical modulator driver illustrated in FIG. 2 includes differential amplifiers Cell-1 to Cell-4 connected in parallel to each other, output transmission lines Lout0 to Lout3 and Loutb0 to Loutb3, input transmission lines Lin1 to Lin4 and Linb1 to Linb4, terminal resistors Re1 to Re4, a positive-phase input terminal Din, a negative-phase input terminal Dinb, a positive-phase output terminal Dout, and a negative-phase output terminal Doutb. The output transmission lines Lout0 to Lout3 and Loutb0 to Loutb3 are transmission lines of characteristic impedance 50 ohm each constituting a distributed constant circuit having inductances of individual wirings and output capacitances (about 20 [fF]) of the respective differential amplifiers Cell-1 to Cell-4. The input transmission lines Lin1 to Lin4 and Linb1 to Linb4 are transmission lines constituting a distributed constant circuit having inductances of individual wirings and input capacitances (about 20 [fF]) of the respective differential amplifiers Cell-1 to Cell-4. The signals each amplified by the respective differential amplifiers Cell-1 to Cell-4 have delay times equal to each other. In addition, delay times of the individual transmission lines are designed such that the delay times are equal to each other at the corresponding input sides and output sides. That is, respective delay times of Lout1 and Loutb1 and Lin1 and Linb1 are equal to each other, respective delay times of Lout2 and Loutb2 and Lin2 and Linb2 are equal to each other, and respective delay times of Lout3 and Loutb3 and Lin3 and Linb3 are equal to each other.

The respective delay times of the differential amplifier and the transmission lines are adjusted as described above, so that the signals input to the positive-phase input terminal Din and the negative-phase input terminal Dinb reaches the respective differential amplifier (Cell-1 to Cell-4) at different phases and the amplified signals output from the respective differential amplifier are superimposed at the same phases in the positive-phase output terminal Dout and in the negative-phase output terminal Doutb, respectively. In multi-level modulation such as PAM-4 and 16QAM using the optical modulator driver (travelling wave amplifier) illustrated in FIG. 2, a communication signals has logic levels of 2N (N=2, 3, 4, . . . ) provided in a direction of amplitude thereof. An interval between any two logic levels adjacent to each other may be constant to restrain an identification error for each logic level. For this reason, the optical modulator driver needs to execute linear amplification.

For example, in FIG. 3 (the case of PAM-4), a differential input voltage Vin-Vinb (horizontal axis) and a differential output voltage Vout-Voutb (vertical axis) have four logic levels (inputs In0 to In3 and outputs Out0 to Out3), respectively. However, if an right-upward part (a slope $\Delta$(Vout−Voutb)/$\Delta$(Vin−Vinb) corresponds to voltage gain) of a curved line becomes a linear form (straight line) for the entire voltage range of input signals from In0 to In3, the respective logic levels are transferred to output signals at the same ratio, while as deviating from the linear form (straight line), the ratio changes depending on the logic levels and waveforms of the output signals are distorted. To perform such linear amplification, the voltage gain of the differential amplifier is set to be smaller than the voltage gain in the case of a saturated operation (broken line). The above explanation referring FIG. 3 has been made for static characteristics. However, because actual modulation is performed by a high-speed pulse signal, frequency characteristics of voltage gain should be flat in a predetermined frequency region. That is, the slope (voltage gain) of the right-upward part of FIG. 3 may be constant for high frequency components of the high-speed pulse signal. Here, Vin shows a positive-phase input voltage input to a positive-phase input terminal Din, Vinb shows a negative-phase input voltage input to a negative-phase input terminal Dinb, and the positive-phase input voltage Vin and the negative-phase input voltage Vinb are complementary voltage signals that have phases opposite to each other. In addition, Vout shows a positive-phase output voltage output from a positive-phase output terminal Dout, Voutb shows a negative-phase output voltage output from a negative-phase output terminal. Doutb, and the positive-phase output voltage Vout and the negative-phase output voltage Voutb are complementary voltage signals that have phases opposite to each other.

Meanwhile, the inventors have discovered that, decrease of voltage gain in the linear amplification performed by a differential amplifier degrades a common-mode rejection ratio (CMRR) in a high frequency region of 5 [GHz] or more and jitter of waveforms of output signals increases. The degradation of CMRR causes increase of an identification error of an optical receiver. The CMRR means that a characteristic is good when a value thereof is large. FIG. 4 illustrates a block diagram of a transmission part including a digital to analog converter (DAC) to generate a differential signal input to the optical modulator driver using the TWA illustrated in FIG. 2. A differential signal output from the DAC is a multi-level modulated signal. After passing through a high-frequency transmission line, the differential signal is input to the optical modulator driver. At this time, due to a difference (skew) of delay times of a positive-phase signal (Vout) side and a negative-phase signal (Voutb) side of the high-frequency transmission line and unbalance of a positive-phase signal and a negative-phase signal of DAC output terminals (DAC-Dout and DAC-Doutb), the differential signal input to the optical modulator driver includes common-mode components, in addition to the original components of the differential signal. The CMRR is represented by the following formula (formula 1):

$$\mathrm{CMRR}=20\times\log_{10}(Ad/Ac) \quad \text{(formula 1)},$$

where Ad is differential voltage gain defined as a ratio of a differential component of an output voltage signal to a differential component of an input voltage signal, Ac is common-mode voltage gain defined as a ratio of a common-mode component of the output voltage signal to a common-mode component of the input voltage signal.

In addition, the inventors have discovered that the CMRR mainly depends on a characteristic of a current source of each differential amplifier in the optical modulator driver using the TWA illustrated in FIG. 2. An example of a circuit structure of each differential amplifier of the optical modulator driver using the TWA illustrated in FIG. 2 is illustrated in FIG. 5 (Because the circuit structure of the differential amplifier illustrated in FIG. 5 is partially equal to a circuit structure illustrated in FIG. 8, the circuit structure will be described in detail below with reference to FIG. 8). Each differential amplifier includes a differential input terminal Da, a differential pair Db, an emitter follower Dc to drive the differential pair Db (emitters of transistors Tr3 and Tr4 are connected via resistors R1 and R2), two cascade transistors (bases of transistors Tr5 and Tr6 are connected to each other) each connected to respective collectors of the differential pair Db, a current source Is, and a differential output terminal Dd. The differential input terminal Da includes a positive-phase input terminal Cell-in and a negative-phase input terminal Cell-inb. The differential output terminal Dd includes a positive-phase output terminal Cell-out and a negative-phase output terminal Cell-outb. The current source Is is connected to a connecting point of the resistors R1, R2 of the differential pair Db and provides a current to the differential pair Db. The current source Is with a transistor Tr7 is considered as an equivalent circuit including parasitic components (a capacitance Cbc and an impedance Zc2) illustrated in FIG. 6, due to electrical characteristics of the transistor Tr7. The capacitance Cbc is a parasitic capacitance between base and collector of the transistor Tr7. The impedance Zc2 is impedance determined by considering a feedback signal by Gm (voltage-to-current gain (ΔIce/ΔVbe) of the transistor Tr7) of the transistor Tr7. At a frequency of about 20 [GHz], the impedance Zc2 is taken to be low as compared with the capacitance Cbc. It has been discovered that the CMRR depends on characteristics of the current source Is.

FIGS. 7A, 7B illustrate simulation results of frequency characteristics (Ac, Ad, and CMRR) of an optical modulator driver using a TWA for a linear amplification system. In FIG. 7A, a horizontal axis shows a frequency [GHz] of an input signal and a vertical axis shows voltage gain [dB] of an output signal. In FIG. 7A, a curve Ac1 shows a result of common-mode voltage gain Ac for the circuit structure of FIG. 5, a curve Ad1 shows a result of differential voltage gain Ad, and a curve Ach shows a result of common-mode voltage gain Ach in the case of using an ideal current source Is not including the parasitic components (the capacitance Cbc and the impedance Zc2) illustrated in FIG. 6, for a comparison. In FIG. 7B, a horizontal axis shows a frequency [GHz] of an input signal and a vertical axis shows a CMRR. [dB] obtained by the results illustrated in FIG. 7A. In FIG. 7B, a curve Cr1 shows a CMRR calculated from the results of the curves Ac1, Ad1 of FIG. 7A using the formula 1 and a curve Crh shows a CMRR calculated from the results of the curves Ach, Ad1 of FIG. 7A using the formula 1.

Referring to FIGS. 7A and 7B, Ac increases by an influence of the capacitance Cbc and the impedance Zc2 at a high frequency and the CMRR decreases accordingly. For example, when the optical modulator driver using a TWA performs a modulation operation at 32 [Gbaud], a common-mode component by the above-mentioned skew appears in a frequency region of 10 to 30 [GHz]. However, in the frequency region, the CMRR causes a difference of 6 to 13 [dB] according to presence or absence of the parasitic components.

Accordingly, the present invention has been made in view of the above problems and an object of the present invention is to provide an optical modulator driver that increases a common-mode rejection ratio in a high frequency region and performs liner amplification suitable for pulse amplitude modulation.

An optical modulator driver according to one embodiment of the present invention is an optical modulator driver in which at least two differential amplifiers each of which includes a differential input terminal (a pair of input terminals) and a differential output terminal (a pair of output terminals) are provided, a differential signal input from the outside are input to the respective differential input terminals via input transmission lines, and differential signals output from the output terminals of the respective differential amplifiers are output to the outside via output transmission lines. The differential amplifier has a differential pair in which emitters of a pair of transistors are connected via first and second resistors and a series circuit in which a third resistor is connected to one end of a first capacitor and a fourth resistor is connected to the other end of the first capacitor. The input terminal is coupled to the differential pair through a resistor part. A connecting point where the emitter of one transistor of the differential pair and the first resistor are connected, and a connecting point where the emitter of the other transistor of the differential pair and the second resistor are connected, are connected through the series circuit.

According to one embodiment of the present invention, an optical modulator driver that enhances a common-mode rejection ratio in a high frequency region and performs liner amplification suitable for pulse amplitude modulation can be provided.

DETAILED DESCRIPTION

Figure 1:
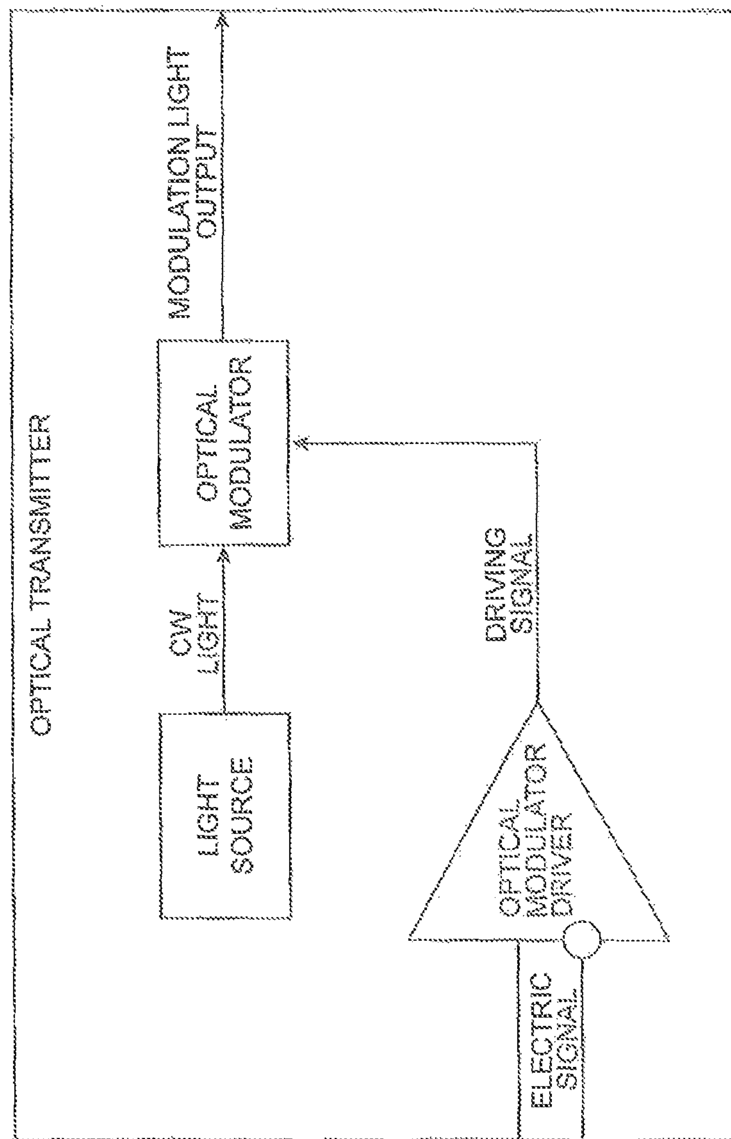
FIG. 1 is a schematic diagram illustrating a structure of an optical transmitter using an optical modulator driver according to an embodiment.

Hereinafter, specific examples of an optical modulator driver and a differential amplifier according to an embodiment of the present invention will be described with reference to the drawings. However, the present invention is not limited to an exemplary form and various changes and modifications can be made without departing from the scope of the present invention. In description of the drawings, the same elements are denoted with the same reference numerals and overlapped explanation is omitted.

Figure 2:
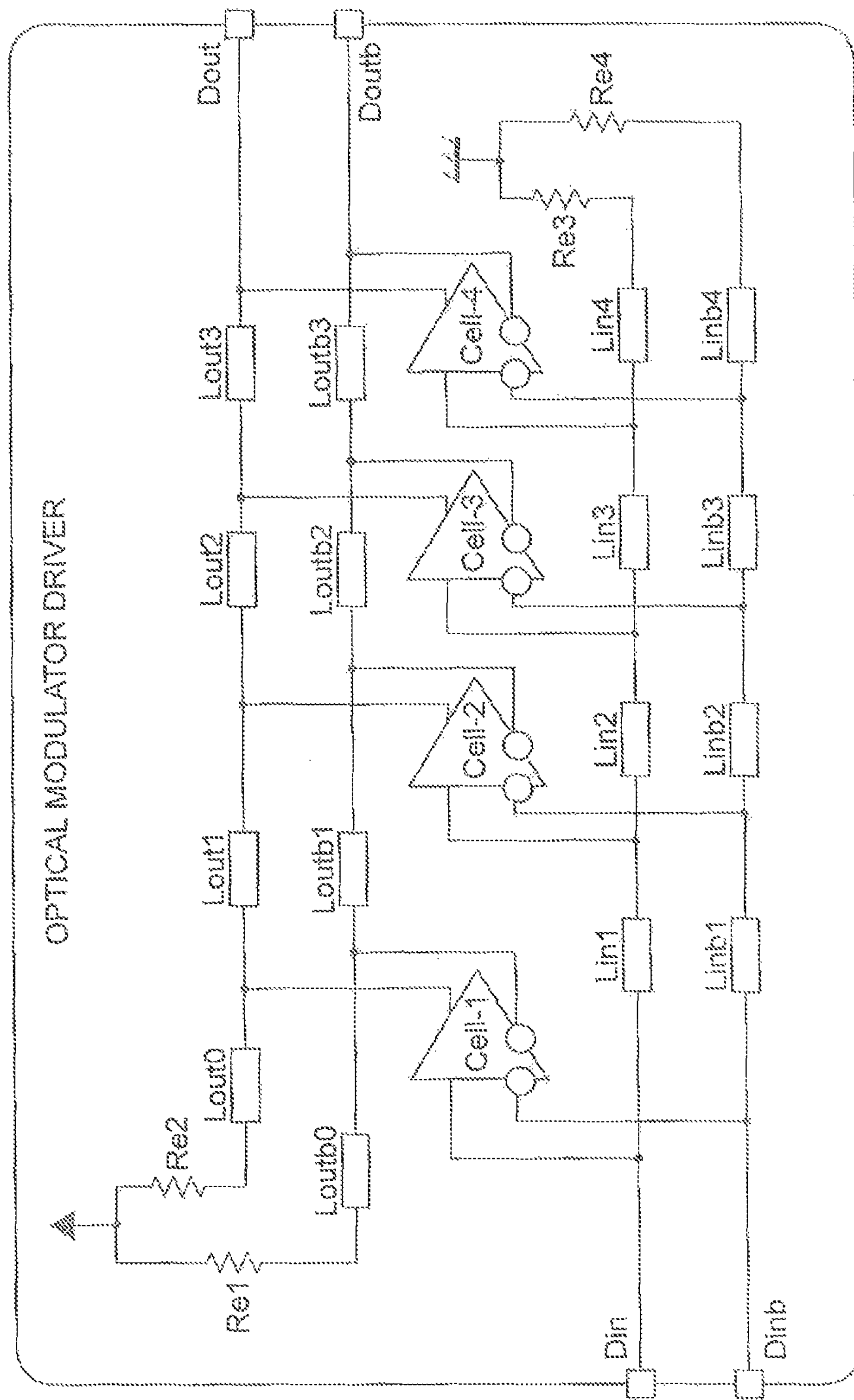
FIG. 2 is a schematic diagram illustrating an optical modulator driver according to the related art.
Figure 3:
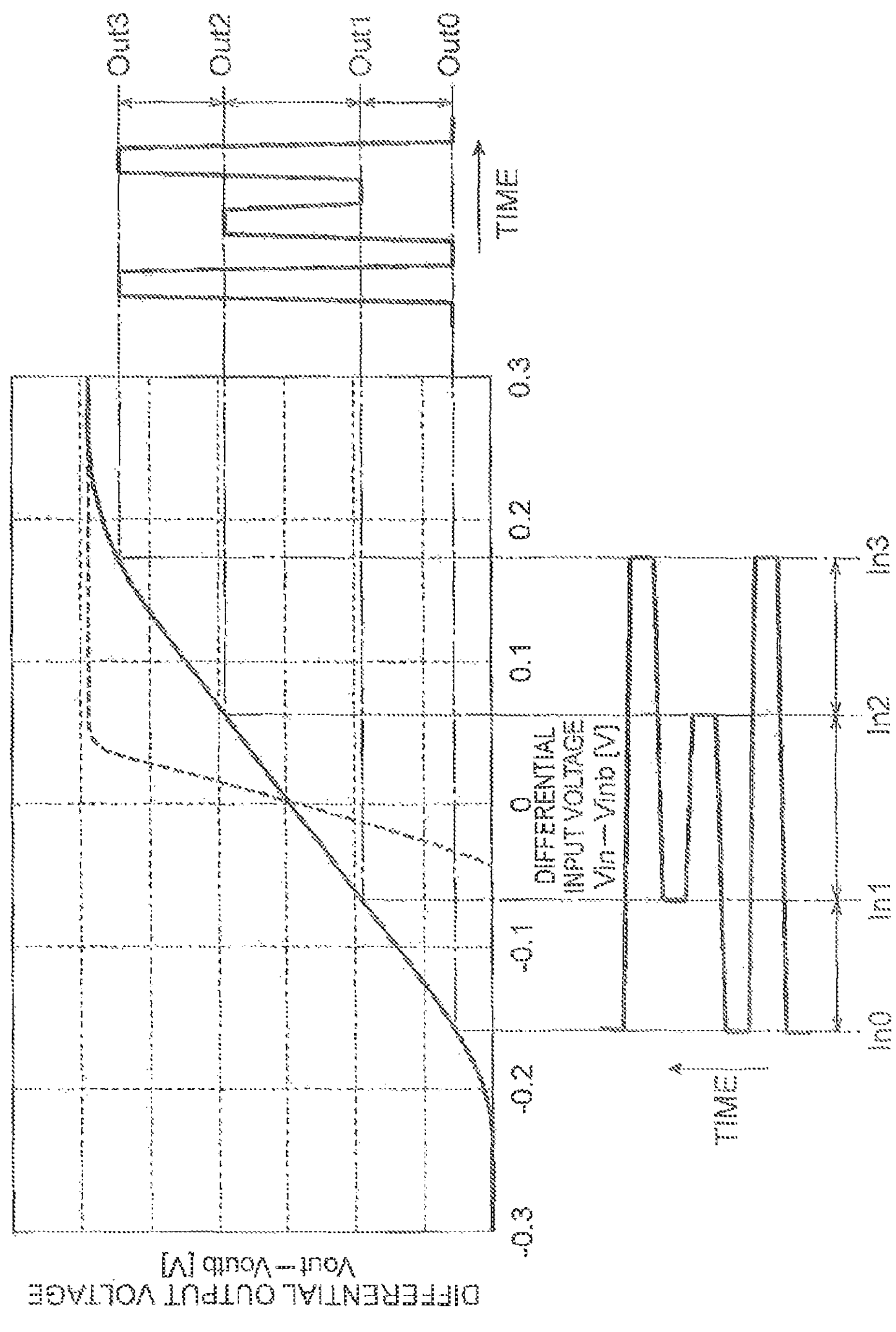
FIG. 3 is an input-to-output characteristic for explaining linear amplification of the optical modulator driver.
Figure 4:
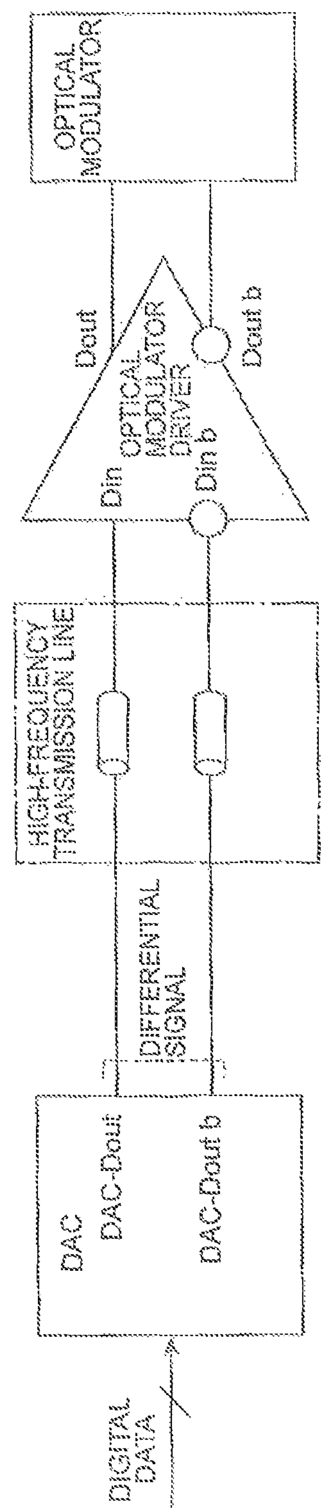
FIG. 4 is a block diagram for explaining that common-mode components are included in a differential input signal of the optical modulator driver.
Figure 5:
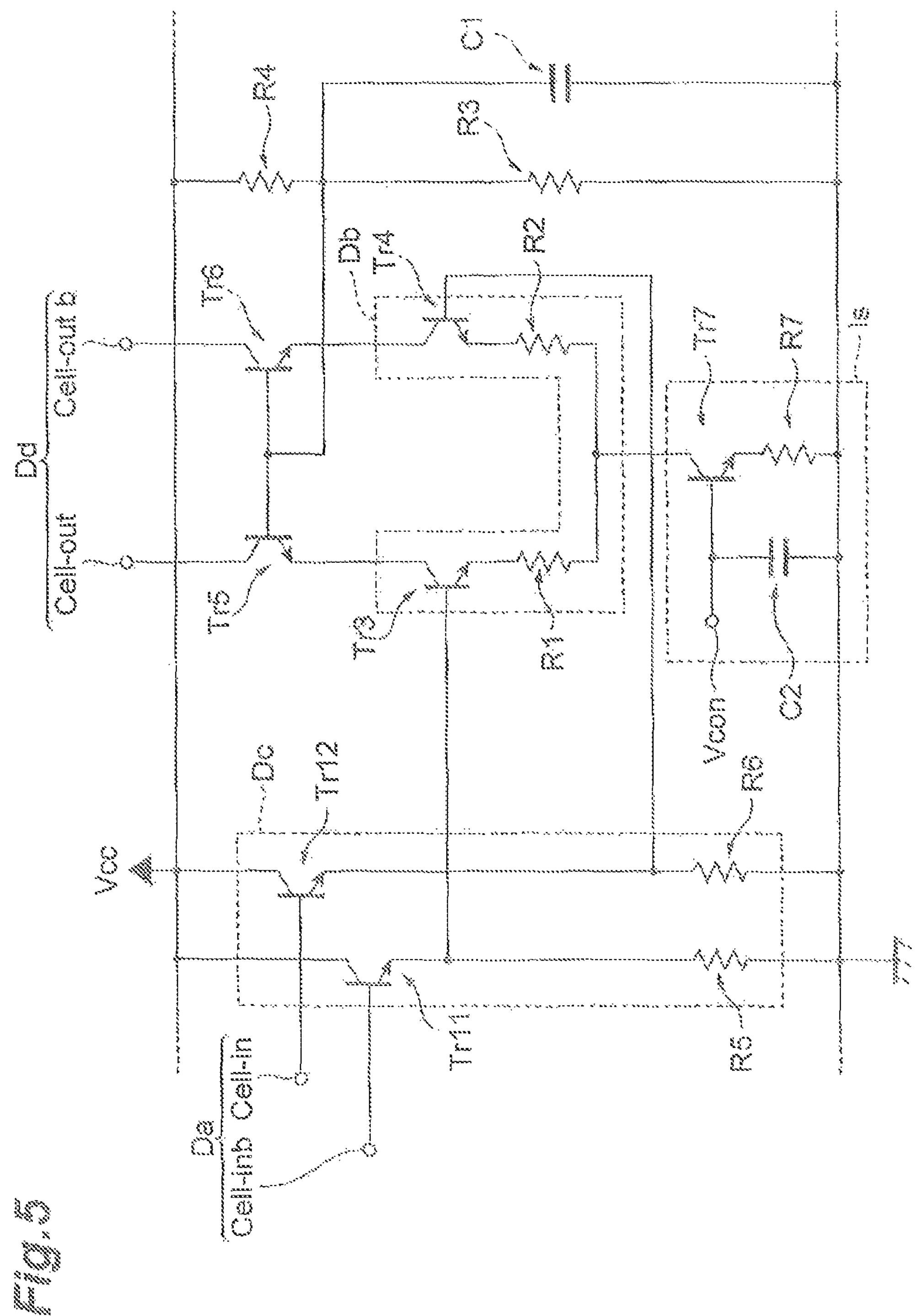
FIG. 5 is a schematic diagram illustrating a differential amplifier according to the related art.
Figure 6:
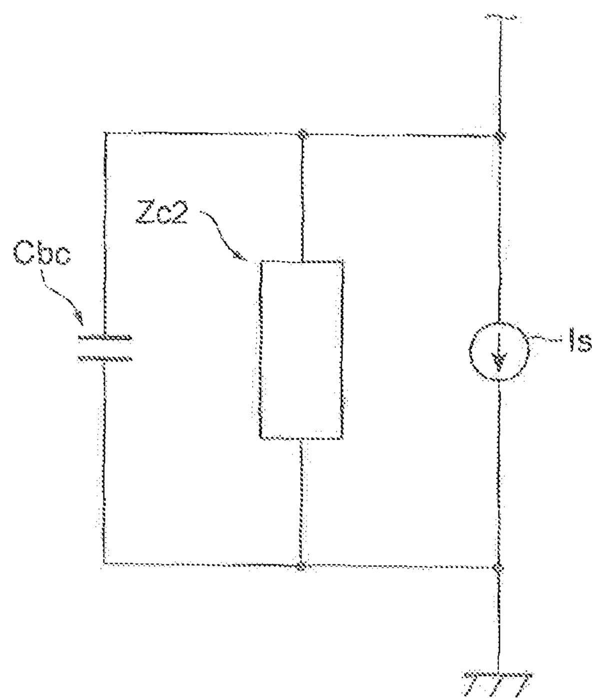
FIG. 6 is an equivalent circuit of a current source of the differential amplifier illustrated in FIG. 5.
Figure 8:
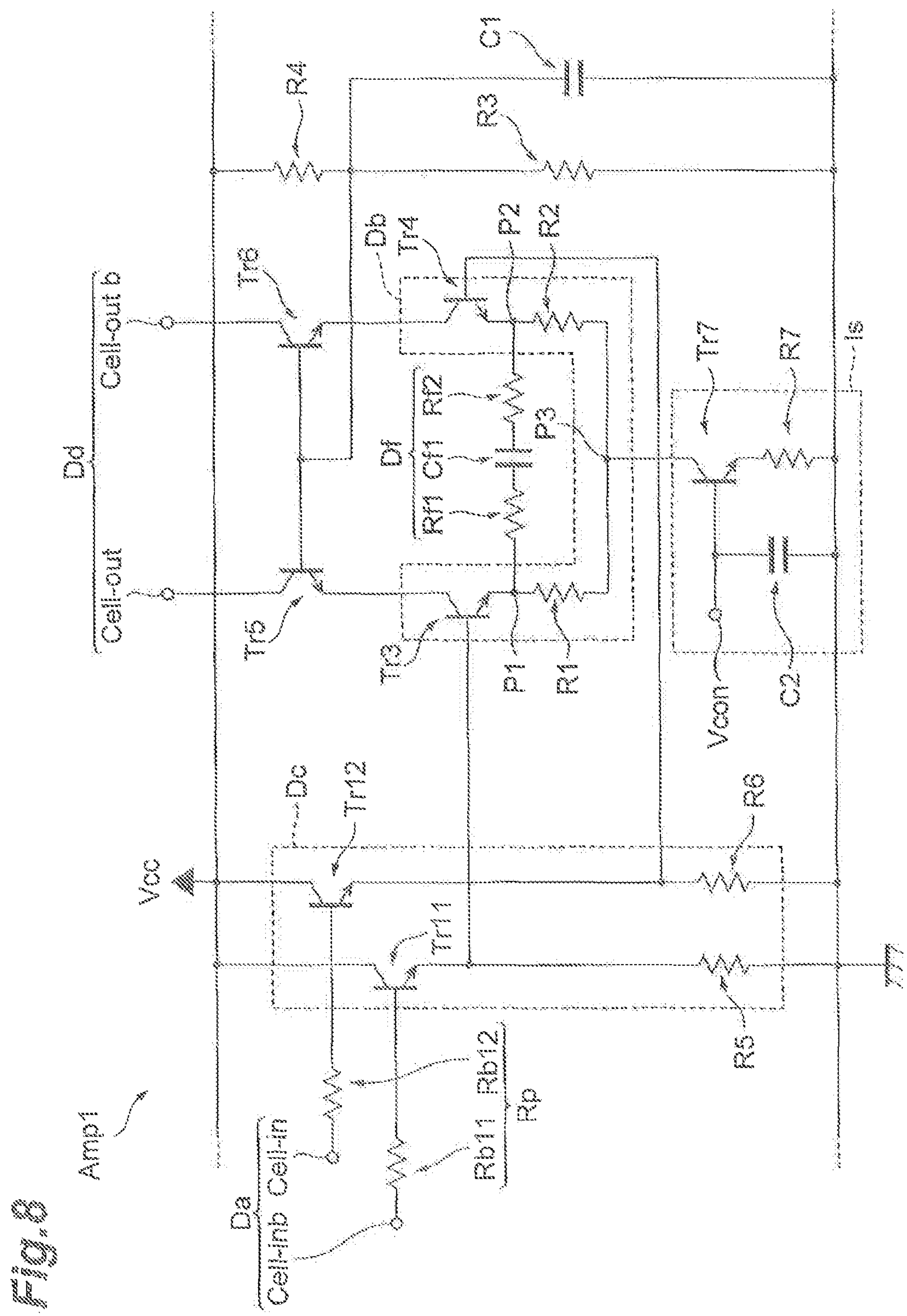
FIG. 8 is a schematic diagram illustrating a differential amplifier according to the embodiment of the present invention.
Figure 9:
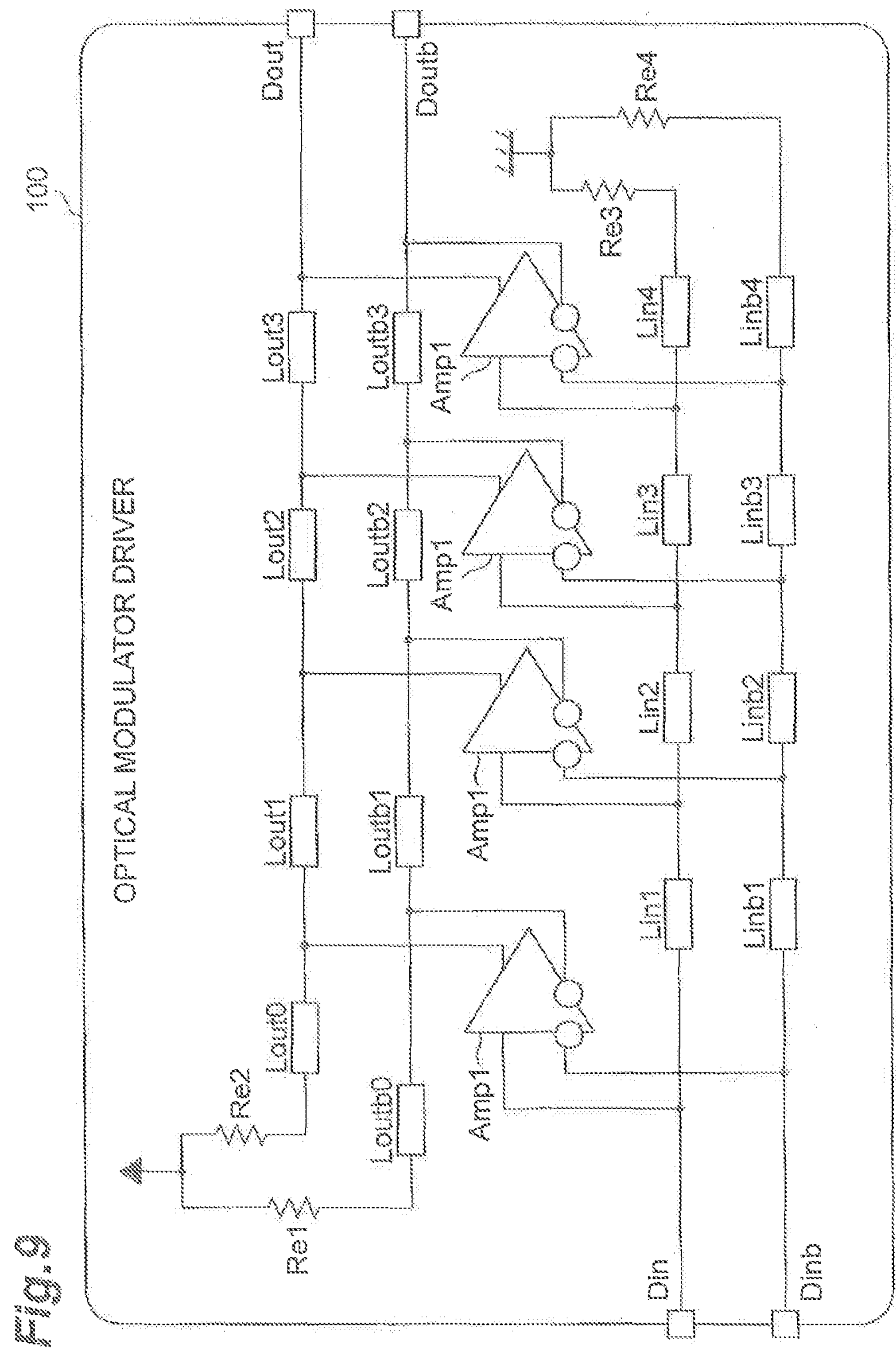
FIG. 9 is a schematic diagram illustrating an optical modulator driver according to the embodiment of the present invention.

FIG. 8 illustrates a circuit structure of a differential amplifier Amp1 according to an embodiment of the present invention. FIG. 9 illustrates a structure of an optical modulator driver 100 according to the embodiment of the present invention. The optical modulator driver 100 is a travelling wave amplifier (TWA). The differential amplifier Amp1 corresponds to each of Cells (Cell-1 to Cell-4) illustrated in FIGS. 2, 5 and the optical modulator driver 100 according to the embodiment uses the differential amplifier Amp1 according to the embodiment, instead of each Cell illustrated in FIG. 2. The differential amplifier Amp1 includes a differential input terminal Da, a differential pair Db, an emitter follower Dc to drive the differential pair Db, two cascade transistors (transistors Tr5, Tr6) connected to respective collectors of the differential pair Db, a current source Is, a differential output terminal Dd, a series circuit Df, and a resistor part Rp. The differential amplifier Amp1 is further provided with the resistor part Rp and the series circuit Df, with respect to a circuit structure of a circuit example of the Cell illustrated in FIG. 5.

The differential input terminal Da includes a positive-phase input terminal Cell-in and a negative-phase input terminal Cell-inb. The differential output terminal Dd includes a positive-phase output terminal Cell-out and a negative-phase output terminal Cell-outb. A pair of positive-phase input signal and negative-phase input signal that have phases opposite to each other is input to the positive-phase input terminal Cell-in and the negative-phase input terminal Cell-inb. An amplified differential input signal is output as a pair of positive-phase output signal and negative-phase output signal that have phases opposite to each other, from the positive-phase output terminal Cell-out and the negative-phase output terminal Cell-outb. Respective polarities of the differential input signal and the differential output signal are determined according to a structure of an optical transmitter used in the optical modulator driver 100, such that the polarities are equal to each other or are inverted to each other. The polarity of the differential signal can be easily inverted by switching the two signals constituting the differential signal.

The resistor part Rp includes a resistor Rb11 (fifth resistor) and a resistor Rb12 (sixth resistor). The negative-phase input terminal Cell-inb and the transistor Tr3 of the differential pair Db are connected via the resistor Rb11. The positive-phase input terminal Cell-in and a transistor Tr4 of the differential pair Db are connected via the resistor Rb12. In detail, the resistor Rb11 is provided between the negative-phase input terminal Cell-inb and base of a transistor Tr11 of the emitter follower Dc. The resistor Rb12 is provided between the positive-phase input terminal Cell-in and base of a transistor Tr12 of the emitter follower Dc.

The emitter follower Dc includes the transistor Tr11, the transistor Tr12, a resistor R5, and a resistor R6. The base of the transistor Tr11 is connected to the negative-phase input terminal Cell-inb via the resistor Rb11. Collector of the transistor Tr11 is connected to a power supply Vcc. Emitter of the transistor Tr11 is grounded via the resistor R5. The emitter of the transistor Tr11 is connected to base of the transistor Tr3 of the differential pair Db. The base of the transistor Tr12 is connected to the positive-phase input terminal Cell-in via the resistor Rb12. Collector of the transistor Tr12 is connected to the power supply Vcc. Emitter of the transistor Tr12 is grounded via the resistor R6. The emitter of the transistor Tr12 is connected to base of the transistor Tr4 of the differential pair Db.

The differential pair Db is comprised of a pair of circuits, one of the circuits including the transistor Tr3 and the resistor R1 (first resistor), the other of the circuits including the transistor Tr4 and the resistor R2 (second resistor). In the differential pair Db, respective emitters of the transistors Tr3, Tr4 are connected to each other via the resistors R1, R2. The base of the transistor Tr3 is connected to the emitter of the transistor Tr11. The emitter of the transistor Tr3 is connected to the resistor R1 at a connecting point P1. The emitter of the transistor Tr3 is connected to the current source Is via the resistor R1. Collector of the transistor Tr3 is connected to emitter of the transistor Tr5. The base of the transistor Tr4 is connected to the emitter of the transistor Tr12. The emitter of the transistor Tr4 is connected to the resistor R2 at a connecting point P2. The emitter of the transistor Tr4 is connected to the current source Is via the resistor R2. The collector of the transistor Tr4 is connected to the emitter of the transistor Tr6.

The transistors Tr5, Tr6 are provided to keep impedance of the differential output terminal Dd high. The base of the transistor Tr5 is connected to the base of the transistor Tr6. The base of each of the transistors Tr5, Tr6 is grounded via a capacitor C1. The collector of the transistor Tr5 is connected to the positive-phase output terminal Cell-out. The collector of the transistor Tr6 is connected to the negative-phase output terminal Cell-outb. The transistors Tr5, Tr6 may be omitted and the collectors of the differential pair Db may be connected directly to the positive-phase output terminal Dout and the negative-phase output terminal Doutb, respectively.

The series circuit Df includes a resistor Rf11 (third resistor), a capacitor Cf1 (first capacitor), and a resistor Rf2 (fourth resistor). In the series circuit Df, the resistor Rf1 is connected to one end of the capacitor Cf1 and the resistor R2 is connected to the other end of the capacitor Cf1. The series circuit Df is connected between the connecting points P1, P2. The resistor Rf1, the capacitor Cf1, and the resistor Rf2 are connected in series in this order. The resistor Rf1 is connected to the emitter of the transistor Tr3 at the connecting point P1. The resistor Rf1 is provided between the emitter of the transistor Tr3 and the capacitor Cf1. The resistor R12 is connected to the emitter of the transistor Tr4 at the connecting point P2. The resistor Rf2 is provided between the emitter of the transistor Tr4 and the capacitor Cf1.

If resistance of the resistor Rf1 is set to rf1, resistance of the resistor Rf2 is set to rf2, resistance of the resistor Rb11 is set to rb11, a resistance of the resistor Rb12 is set to rb12, and capacitance of the capacitor Cf1 is set to cf1, these values satisfy the following condition: 0<rf1, rf2≤50 [Ω]; 10≤cf1≤300 [fF]; and 10≤rb11, rb12≤200 [Ω]. If the resistance of the resistor R1 is set to r1 and the resistance of the resistor R2 is set to r2, r1 and r2 should be equal to each other. In addition, a lower limit of rf1 is about 3 [Ω] and lower limits of r1 and r2 are about 3 [Ω].

The current source Is includes a transistor Tr7, a resistor R7, and a capacitor C2. One end of the current source Is is connected to a connecting point P3 of the resistors R1, R2. The current source Is is connected to the differential pair Db and provides a current to the differential pair Db. Base of the transistor Tr7 is connected to a voltage terminal Vcon. The base of the transistor Tr7 is grounded via the capacitor C2. Emitter of the transistor Tr7 is grounded via the resistor R7. Collector of the transistor Tr7 is connected to the emitter of the transistor Tr3 via the resistor R1 and is connected to the emitter of the transistor Tr4 via the resistor R2. The capacitor C2 restrains high-frequency oscillation of voltage potential applied to base of the transistor Tr7. By adjusting a direct-current (DC) voltage applied from the outside to the voltage terminal Vcon, the magnitude of a collector current of the transistor Tr7 can be changed. The collector current becomes a current provided by the current source Is. That is, the transistor Tr7 operates as a voltage-controlled current source.

One end of the resistor R4 is connected to the power supply Vcc and one end of the resistor R3 is grounded. The other end of the resistor R4 is connected to the other end of the resistor R3. That is, the resistors R3, R4 are connected in series between the power supply Vcc and a ground. The resistors R3, R4 are names given to distinguish two resistors and the names thereof may be switched. A connecting point of the resistors R4, R3 is connected to the base of the transistor Tr5 and the base of the transistor Tr6. The resistors R3, R4 constitute a so-called voltage divider that adjusts the voltage potential applied to the base of each of the transistors Tr5, Tr6 by changing a ratio of respective resistances.

Figure 7A:
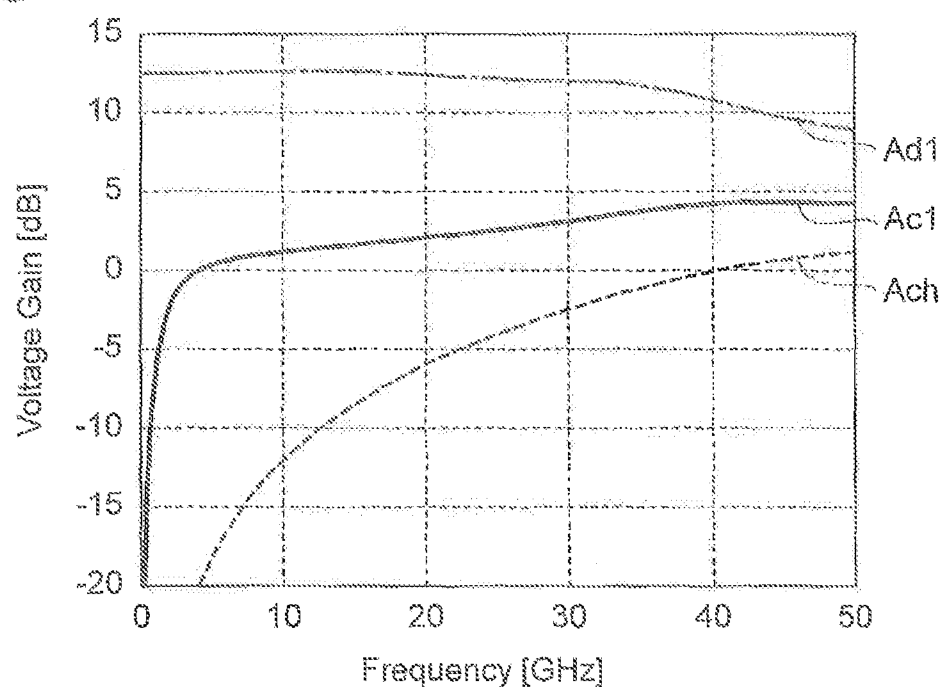
FIGS. 7A, 7B are frequency characteristics of the optical modulator driver according to the related art.
Figure 7B:
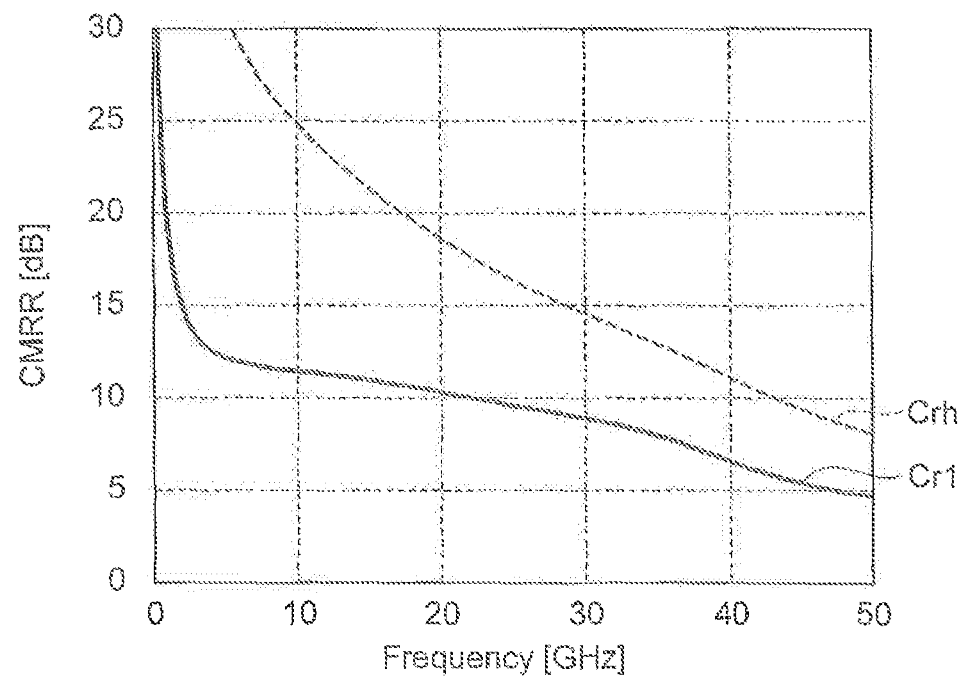
Figure 10:
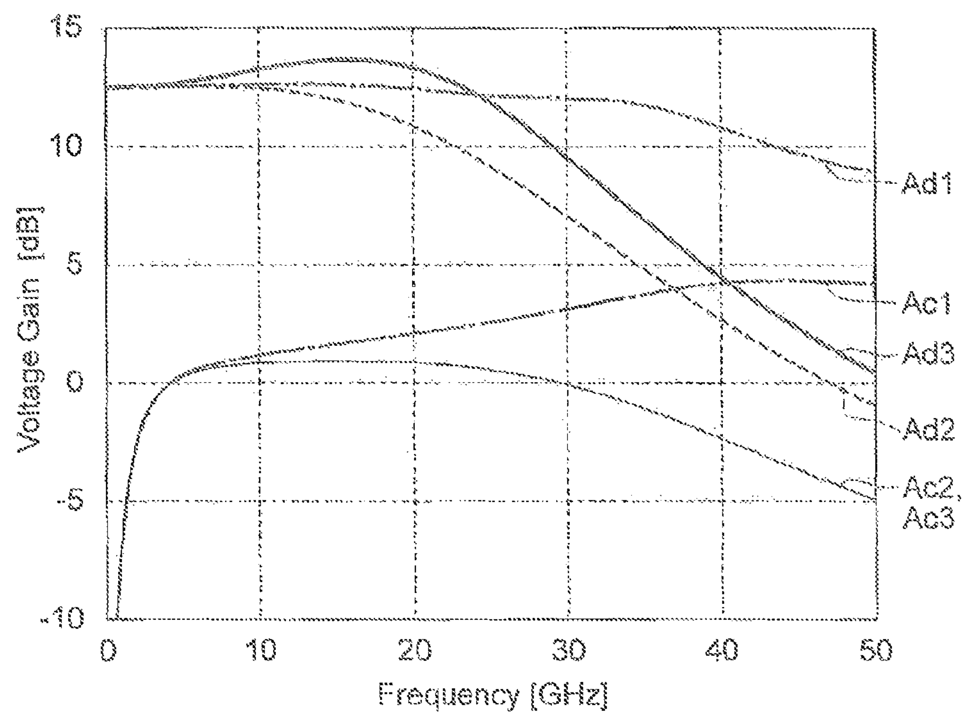
FIG. 10 is a diagram illustrating voltage gain of the optical modulator driver according to the embodiment of the present invention.
Figure 11:
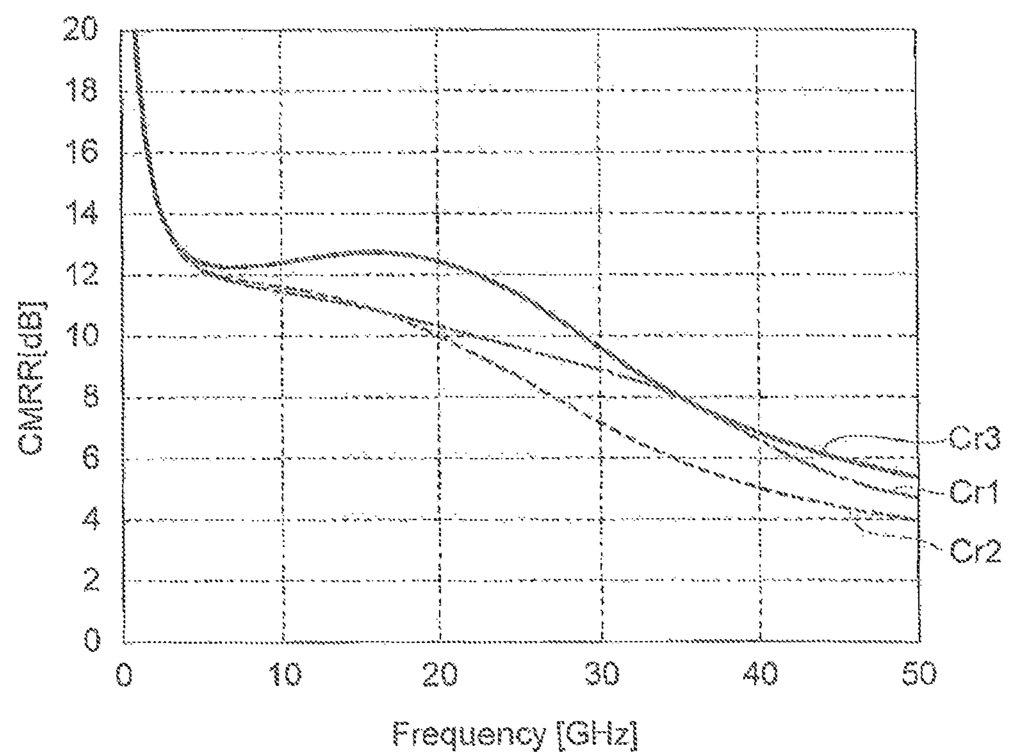
FIG. 11 is a diagram illustrating a common-mode rejection ratio of the optical modulator driver according to the embodiment of the present invention.

Advantages of the optical modulator driver 100 that includes the differential amplifier Amp1 having the structure described above are illustrated in FIGS. 10, 11. A curve Ac1 (comparative example 1) of FIG. 10 shows the same simulation results as a curve Ac1 of FIG. 7A and a curve Ad1 (comparative example 1) of FIG. 10 shows the same simulation results as a curve Ad1 of FIG. 7A. A curve Ac2 (comparative example 2) of FIG. 10 shows simulation results for Ac obtained using a circuit obtained by removing the series circuit Df from the differential amplifier Amp1, that is, a circuit obtained by adding only the resistor part Rp to a circuit illustrated in FIG. 5. Likewise, a curve Ad2 (comparative example 2) of FIG. 10 shows simulation results for Ad obtained using the circuit obtained by removing the series circuit Df from the differential amplifier Amp1, that is, the circuit obtained by adding only the resistor part Rp to the circuit illustrated in FIG. 5. A curve Ac3 (embodiment) of FIG. 10 illustrates simulation results for Ac obtained using the differential amplifier Amp1. A curve Ad3 (embodiment) of FIG. 10 illustrates simulation results for Ad obtained using the differential amplifier Amp1. A curve Cr1 (comparative example 1) of FIG. 11 shows the same simulation results as a curve Cr1 of FIG. 7B. A curve Cr2 (comparative example 2) of FIG. 11 shows simulation results obtained using the circuit obtained by removing the series circuit Df from the differential amplifier Amp1, that is, the circuit obtained by adding only the resistor part Rp to the circuit illustrated in FIG. 5 and shows a CMRR calculated using a formula 1, from the curves Ac2, Ad2 of FIG. 10. A curve Cr3 (embodiment) of FIG. 11 shows simulation results obtained using the differential amplifier Amp1 and shows a CMRR calculated using the formula 1, from the curves Ac3, Ad3 of FIG. 10.

For example, in the case of a symbol rate of 32 Gbaud, an improvement effect of the CMRR is obtained in a frequency range of 10 to 30 [GHz]. As illustrated in FIG. 11, in the curve Cr3 according to the embodiment, an improvement effect of a maxim of 2 [dB] is obtained as compared with the curve Cr1 according to the comparative example 1. From the frequency range, in the curve Cr1 according to the comparative example 1, if the frequency exceeds 5 [GHz], the CMRR becomes gradually smaller than 12 [dB]. However, in the curve Cr3 according to the embodiment, the CMRR becomes 12 [dB] or more up to a frequency of about 22 [GHz] and the frequency range is greatly extended.

The advantages according to this embodiment of the present invention is explained with referring the characteristics of Ad, Ac illustrated in FIG. 10, on the basis of the formula 1. That is, for the curves Ac1, Ad1 according to the comparative examples, common-mode voltage gain Ac1 gradually increases with increase of frequency at 10 [GHz] or more as compared with the differential voltage gain Ad1, because the impedance Zc2 acts as parasitic impedance of collector of the current source Is Accordingly, the CMRR Cr1 decreases with increase of frequency, as the ratio Ad1/Ac1 decreases in the formula 1. Use of the resistor part Rp inserted between the differential input terminal Da and the differential pair Db restrains both Ac, Ad (correspond to the curves Ac2, Ad2 according to the comparative example 2). In this situation, the CMRR (Cr2) is degraded as compared with the comparative example 1 (Cr1). However, The embodiment of the present invention provide the series circuit Df in the differential amplifier for applying positive feedback, so that only Ad is improved while Ac is still constrained, and the CMRR is improved (correspond to the curves Ac3, Ad3 in FIG. 10 and Cr3 in FIG. 11 according to the embodiment).

For the linear amplification, flatness (within variation±2 [dB] as a practical standard) of Ad is necessary. Such flatness of Ad is sufficiently satisfied by providing the series circuit Df with the resistor part Rp.

(Modification)

Figure 12:
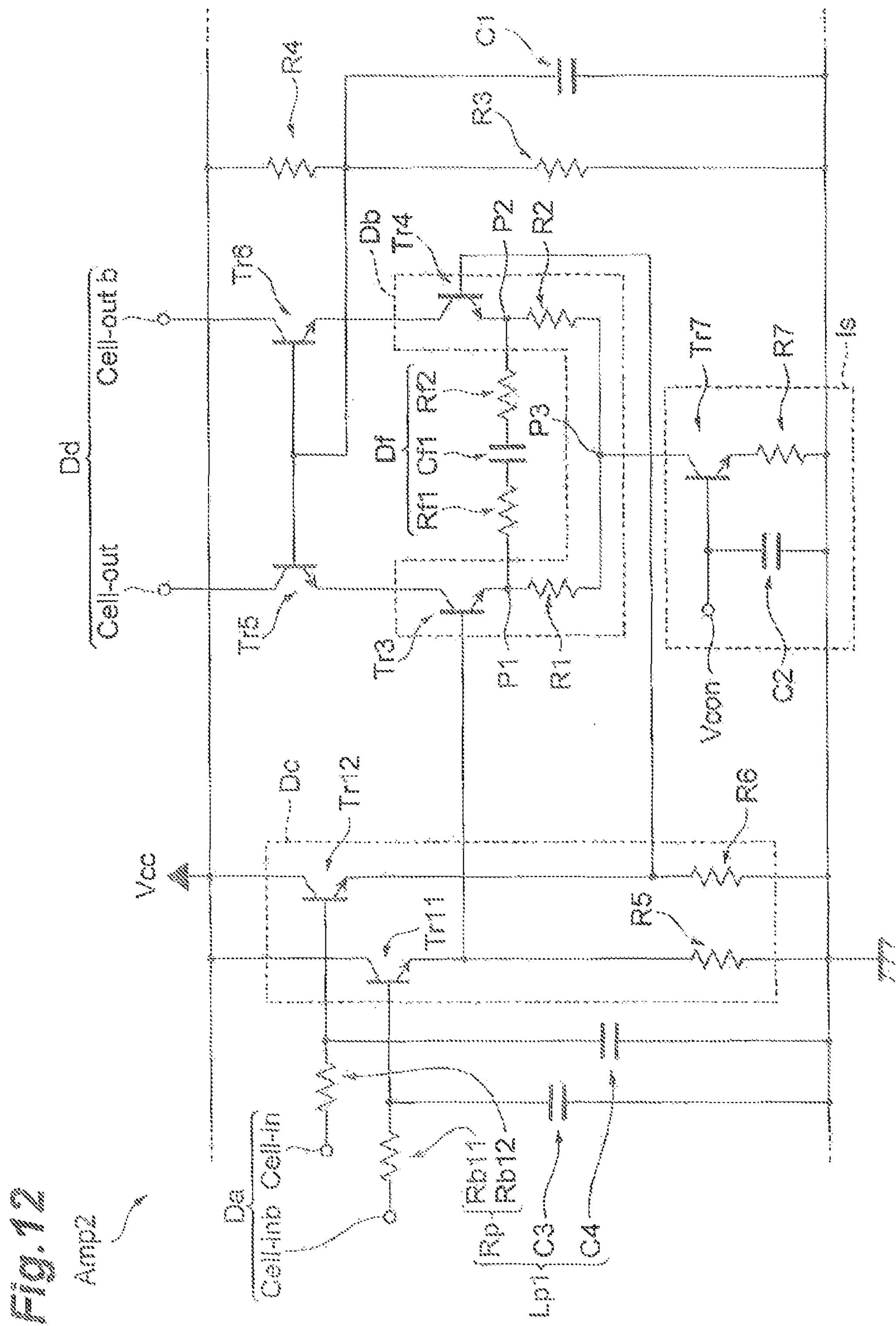
FIG. 12 is a schematic diagram illustrating a modification of the differential amplifier according to the embodiment of the present invention.
Figure 13:
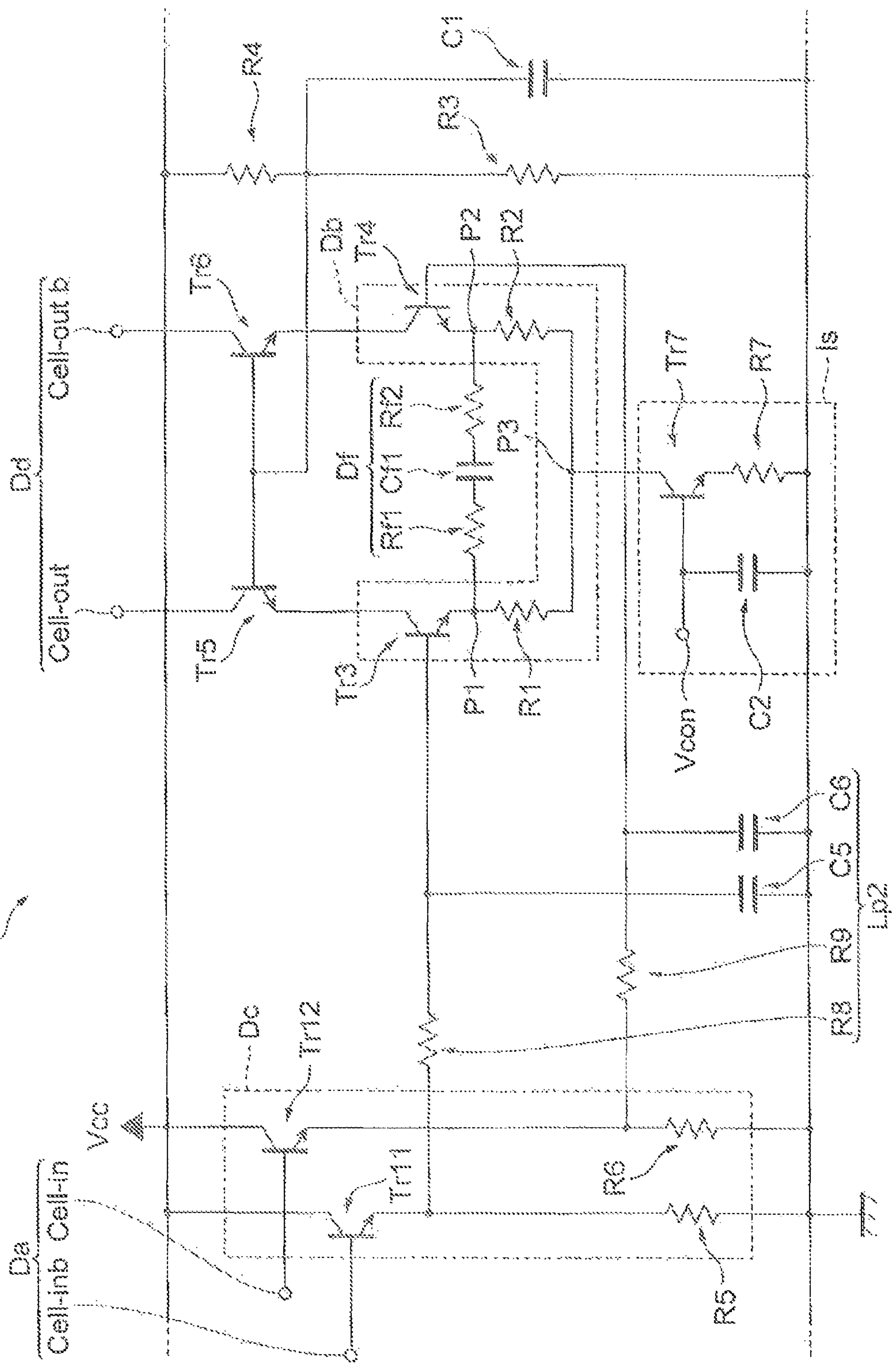
FIG. 13 is a schematic diagram illustrating another modification of the differential amplifier according to the embodiment of the present invention.

FIG. 12 illustrates a structure of a differential amplifier Amp2 according to a first modification of the differential amplifier Amp1. The differential amplifier Amp2 according to the first modification illustrated in FIG. 12 is different from the differential amplifier Amp1 according to the embodiment in that a capacitor C3 and a capacitor C4 are provided between the resistor part Rp and the emitter follower Dc. A low-pass filter Lp1 is constituted of the resistor part Rp, the capacitor C3, and the capacitor C4 (that is, instead of the resistor part Rp, the low-pass filter Lp1 is provided in the differential amplifier Amp1). The low-pass filter Lp1 includes two low-pass filters, that is, a low-pass filter (first low-pass filter) having the resistor Rb11 and the capacitor C3, and a low-pass filter (second low-pass filter) having the resistor Rb12 and the capacitor C4. The negative-phase input terminal Cell-inb and the transistor Tr3 of the differential pair Db are connected to each other via the low-pass filter having the resistor Rb11 and the capacitor C3. The positive-phase input terminal Cell-in and the transistor Tr4 of the differential pair Db are connected to each other via the low-pass filter having the resistor Rb12 and the capacitor C4. One end of the capacitor C3 is connected to the resistor Rb11 and the base of the transistor Tr11, and the other end of the capacitor C3 is grounded. One end of the capacitor C4 is connected to the resistor Rb12 and the base of the transistor Tr12, and the other end of the capacitor C4 is grounded. FIG. 13 illustrates a structure of a differential amplifier Amp3 according to a second modification of the differential amplifier Amp1.

The differential amplifier Amp3 according to the second modification illustrated in FIG. 13 is different from the differential amplifier Amp1 according to the embodiment in that the resistor part Rp is not provided and a low-pass filter Lp2 is provided between the emitter follower Dc and the differential pair Db. The low-pass filter Lp2 includes capacitors C5, C6 and resistors R8, R9. The low-pass filter Lp2 includes two low-pass filters, that is, a low-pass filter (third low-pass filter) having the resistor R8 and the capacitor C5, and a low-pass filter (fourth low-pass filter) having the resistor R9 and the capacitor C6. The negative-phase input terminal Cell-inb and the transistor Tr3 of the differential pair Db are connected to each other via the low-pass filter having the resistor R8 and the capacitor C5. The positive-phase input terminal Cell-in and the transistor Tr4 of the differential pair Db are connected to each other via the low-pass filter having the resistor R9 and the capacitor C6. The resistor R8 is provided between the emitter of the transistor Tr11 and the base of the transistor Tr3, and the base of the transistor Tr3 is grounded via the capacitor C5. The resistor R9 is provided between the emitter of the transistor Tr12 and the base of the transistor Tr4, and the base of the transistor Tr4 is grounded via the capacitor C6.

In the first and second modifications, it is confirmed that the same advantages (advantages corresponding to the curved lines Ac3, Ad3, and Cr3) as the differential amplifier Amp1 according to the embodiment illustrated in FIGS. 9, 10 are achieved. Therefore, similar to the differential amplifier Amp1 according to the embodiment of the present invention, the CMRR has been improved using the low-pass filter Lp1 and the series circuit Df as in the differential amplifier Amp2 according to the first modification and using the low-pass filter Lp2 and the series circuit Df as in the differential amplifier Amp3 according to the second modification.

What is claimed is:

1. An optical modulator driver for generating a driving signal from an input signal, comprising:
- an input transmission line configured to externally receive the input signal at one end thereof and configured to transmit the input signal;
- differential amplifiers each having,
  - an input terminal and an output terminal, the input terminal being configured to receive the input signal from the input transmission line,
  - a differential pair including a pair of transistors, a first resistor and a second resistor, the transistors having emitters connected to each other through the first and second resistors, and collectors generating an amplified signal to be output from the output terminal,
  - a series circuit including a third resistor, a fourth resistor, and a first capacitor, the third resistor in one end thereof being connected to one end of the fourth resistor through the first capacitor, the third resistor in another end thereof being connected to the emitter of one of the transistors, the fourth resistor in another end thereof being connected to the emitter of the other of the transistors, and
  - a resister part including at least one input resistor, the resistor part coupling the input terminal to the differential pair for providing the input signal to the pair of transistors; and
- an output transmission line configured to receive the amplified signals output from the output terminals of the differential amplifiers and output the driving signal at one end thereof as a sum of the amplified signals.

2. The optical modulator driver according to claim 1, wherein each differential amplifier further includes at least one input capacitor provided between the resistor part and the differential pair, the at least one input resistor and the at least one input capacitor constituting a low pass filter.

3. The optical modulator driver according to claim 1, wherein each differential amplifier further includes an emitter follower and a low pass filter, the emitter follower being configured to receive the input signal from the input terminal through the resistor part and configured to output a shifted signal to the differential pair in response to the input signal, the low pass filter being configured to output a filtered signal to the emitter follower.

* * * * *